United States Patent [19]
Crafts et al.

[11] Patent Number: 5,140,180
[45] Date of Patent: Aug. 18, 1992

[54] HIGH SPEED CMOS FLIP-FLOP EMPLOYING CLOCKED TRISTATE INVERTERS

[75] Inventors: Harold S. Crafts; Robert D. Waldron, both of Fort Collins, Colo.

[73] Assignee: NCR Corporation, Dayton, Ohio

[21] Appl. No.: 572,596

[22] Filed: Aug. 24, 1990

[51] Int. Cl.$^5$ .................. H03K 3/26; H03K 17/16
[52] U.S. Cl. .................. 307/279; 307/443; 307/451; 307/272.1; 307/480; 307/481
[58] Field of Search ............ 307/443, 448, 451, 272.1, 307/279, 480–481

[56] References Cited

U.S. PATENT DOCUMENTS

| | | | |
|---|---|---|---|
| 4,463,440 | 7/1984 | Nishiura et al. | 307/269 |
| 4,568,842 | 2/1986 | Koike | 307/279 |
| 4,628,217 | 12/1986 | Berndt | 307/467 |
| 4,691,122 | 9/1987 | Schnizlein et al. | 307/279 |
| 4,777,388 | 10/1988 | Widener | 307/272.2 |
| 4,785,204 | 11/1988 | Terado et al. | 307/279 |
| 4,810,908 | 3/1989 | Suzuki et al. | 307/480 |
| 4,932,002 | 6/1990 | Houston | 365/207 |
| 5,017,815 | 5/1991 | Shah et al. | 307/279 |
| 5,036,217 | 7/1991 | Rollins et al. | 307/272.2 |

*Primary Examiner*—Stanley D. Miller
*Assistant Examiner*—Margaret Rose Wambach
*Attorney, Agent, or Firm*—James M. Stover

[57] ABSTRACT

A high speed, D-type flip-flop is implemented using eight complementary metal-oxide semiconductor (CMOS) tristate inverters. The flip-flop includes both D and D/ data input terminals and parallel data paths from the data input terminals to Q and Q/ output terminals. The improved circuit design realizes higher operating speed than prior CMOS flip-flops by eliminating the inverter delays present in single path flip-flops and providing only two gates in the data paths between the input and output terminals.

6 Claims, 3 Drawing Sheets

HIGH SPEED CMOS FLIP-FLOP EMPLOYING CLOCKED TRISTATE INVERTERS

The present invention relates to flip-flops and, more particularly, to a high speed clocked D-type flip-flop implemented in CMOS logic.

BACKGROUND OF THE INVENTION

Metal Oxide Semiconductor (MOS) devices are used extensively in the design of integrated circuits due to the simplicity of their geometry, very small physical size, and extremely small power dissipation. These attributes permit large scale integration (LSI) in which thousands of MOS transistors are contained in one circuit which occupies only a fraction of a square inch of area.

Despite the advantages recited above, MOS logic gates are often not well suited to applications requiring high speed operation. Such applications are possibly better executed by logic devices implemented in the considerably faster TTL (Transistor-Transistor Logic) or ECL (Emitter Coupled Logic) technologies. Although generally faster, TTL and ECL gates dissipate much more power than MOS logic gates.

To simplify and accelerate the design and development of large scale integrated circuits and very large scale integrated (VLSI) circuits, NCR Corporation, as well as others in the semiconductor industry, have designed libraries of commonly used logic circuit functions. These logic circuit functions, referred to as "cells", can include simple structures such as gates and latches or more complex structures such as RAMs, ROMs and PLAs. In addition, the cells can consist of arrays of logic gates or arrays of "cell macros", logic elements performing higher level logic functions than basic gates. Thereafter in the design of a new integrated circuit the system designer can access the cell library to copy a previously designed and tested circuit which performs a function required by the new integrated circuit under design. The use of cell libraries has substantially reduced the design effort required to design complex components.

One of the recurring requirements for new integrated circuit designs is the need for a high speed flip-flop. There are specific applications where the flip-flop designs currently used in the cell libraries are not fast enough to satisfy customer needs.

A schematic illustration of a typical prior art CMOS (Complementary Metal Oxide Semiconductor) clocked D-type flip-flop is shown in FIG. 1. This schematic diagram appears on page 2-89 of the High Speed CMOS Logic Data Book, Copyright 1987 Texas Instruments Incorporated. The flip-flop includes a master section comprised of transmission gates 10 and 12, NAND gate 14 and negative logic input OR gate 16. The output of the master section, i.e. the output of gate 14, is provided to a slave section including transmission gates 20 and 22, and NAND gate 24 and negative logic input OR gate 26. Gates 16 and 24 could alternatively be represented as NAND gates. The transmission gates are controlled by a clock signal C, a LOW clock signal state causing gates 10 and 22 to be active and gates 12 and 20 to be inactive, and a HIGH clock signal state causing gates 10 and 22 to be inactive and gates 12 and 20 to be active.

Operation of the circuit of FIG. 1 is as follows. Consider that initially the clock is HIGH so that transmission gates 10 and 22 are inactive and transmission gates 12 and 20 are active. The flip-flop will have at its output data from the previous clock cycle. Now when the clock goes LOW, gates 10 and 22 will be actived and gates 12 and 20 will be inactived. Data received at input terminal D will appear complemented at the output of the master section. When the clock thereafter goes HIGH, gates 12 and 20 will be actived and gates 10 and 22 will be inactived. The data state present at the output of the master section will be transferred to the Q output of the flip-flop. One complete clock cycle is required to effectuate the transfer of data from input D to output Q.

Preset (PRE/) and Clear (CLR/) inputs are provided to set or reset the outputs regardless of the level of the D and clock inputs. Note that there is only one data path through the flip-flop and that Q/, is produced by inverting Q. Thus, output Q/ lags output Q by the propagation delay of NAND gate 26.

OBJECTS OF THE INVENTION

It is an object of the present invention to provide a new and improved flip-flop.

It is another object of the present invention to provide such a flip-flop for use in applications requiring high speed.

It is yet another object of the present invention to provide such a flip-flop for inclusion into design cell libraries.

It is still a further object of the present invention to provide a new and improved CMOS flip flop which is considerably faster than prior art CMOS flip-flops.

SUMMARY OF THE INVENTION

There is provided, in accordance with the present invention, a CMOS flip-flop circuit including a first input terminal for receiving a binary input signal, a second input terminal for receiving the complement of the first terminal input signal, a Q output terminal for providing a binary output signal and a Q/ output terminal for providing the complement of the Q terminal output signal. Two data paths through the flip-flop are provided. The first data path provides the state, HIGH or LOW, of the binary input signal received at the first input terminal to the Q output terminal and the second data path provides the state of the complemented binary input signal received at the second input terminal to the Q/ output terminal.

In the described embodiment, the flip-flop is a clocked, CMOS, D-type flip-flop including a master section and a slave section, each section comprising four tristate inverters. The circuit design is described for use in cell libraries and includes clock enable means incorporated into the circuit.

The above objects and other objects, features, and advantages of the present invention will become apparent from the following detailed specification when read in conjunction with the accompanying drawings in which applicable reference numerals have been carried forward.

DETAILED DESCRIPTION OF THE PREFERRED EMBODIMENT

Figure 1:
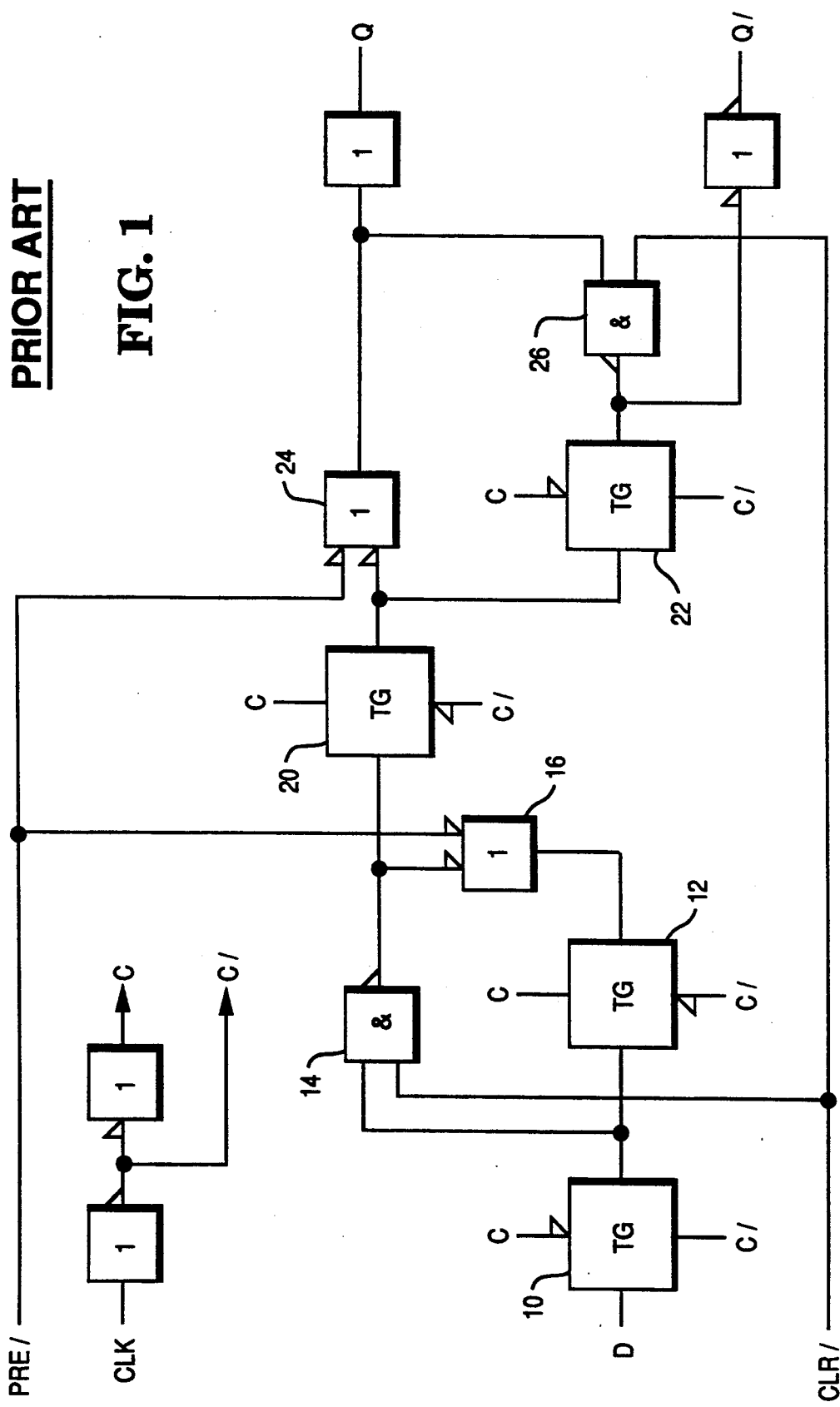
FIG. 1 is a logic diagram of a prior art, D-type flip-flop implemented in CMOS technology.
Figure 2:
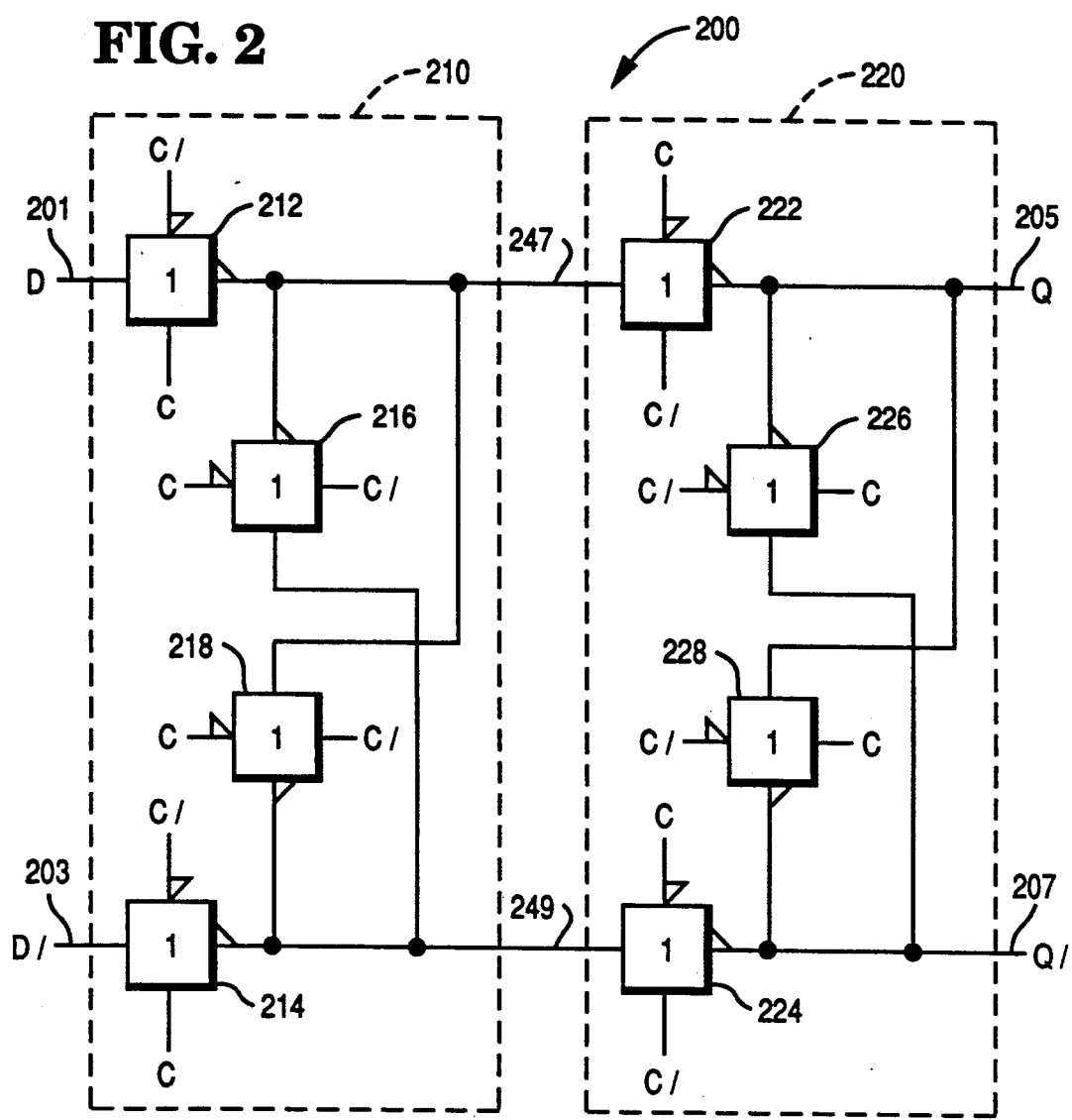
FIG. 2 is a schematic of a high speed, CMOS D-type flip-flop, according to the present invention.
Figure 2:
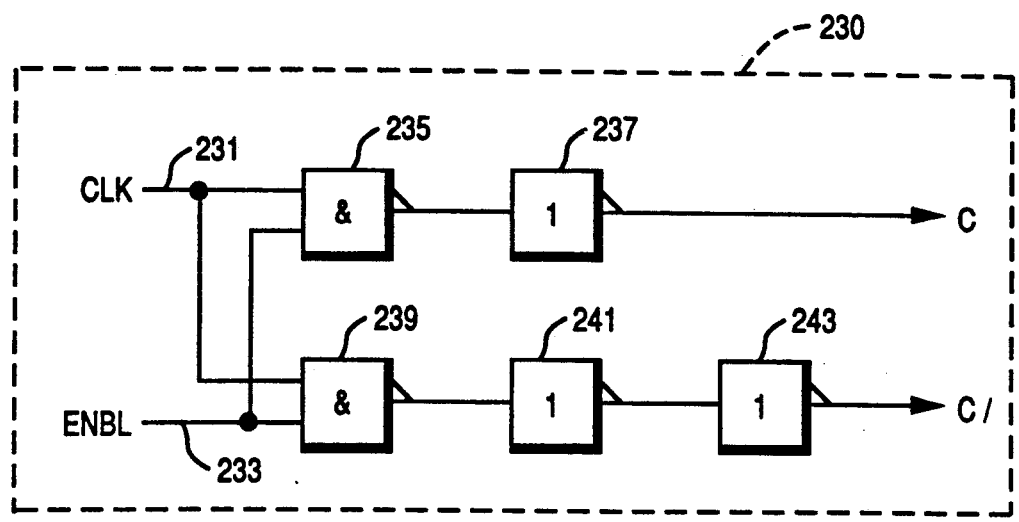

Referring now to FIG. 2, there is seen a schematic of a high speed, CMOS D-type flip-flop 200, according to the present invention. The flip-flop includes two input terminals 201 and 203, a master section 210, a slave section 220, and two output terminals 205 and 207 and a clock enable circuit 230. The master section comprises four CMOS tristate inverters 212, 214, 216 and 218, hereinafter referred to as TI 212, TI 214, TI 216 and TI 218. The input of TI 212 is connected to input terminal 201. Similarly, the input of TI 214 is connected to input terminal 203. TI 216 has its input connected to the outputs of TI 214 and TI 218 and its output coupled to the output of TI 212. Likewise, TI 218 has its input connected to the output of TI 212 and TI 216 and its output coupled to the output of TI 214. Line 247, which is connected to the outputs of TI 212 and TI 216, forms one output of master section 210, and line 249, which is connected to the outputs of TI 214 and TI 218, forms a second output of the master section.

Slave section 220 is identical in construction to master section 210. The slave section includes CMOS tristate inverter 222, 224, 226 and 228 connected together as follows. TI 222 has its input connected to line 247. TI 224 has its input connected to line 249. TI 226 has its input connected to the outputs of TI 224 and TI 228 and its output connected to the output of TI 222. And TI 228 has its input connected to the outputs of TI 222 and TI 226 and its output connected to the output of TI 224. The outputs of TI 222 and TI 226 are connected to output terminal 205 and the outputs of TI 224 and TI 228 are connected to output terminal 207.

Each of the tristate inverters described above includes p and n control inputs connected to receive clock and complemented clock signals. The n control inputs of TI 212, TI 214, TI 226 and TI 228 and the p control inputs of TI 216, TI 218, TI 222 and TI 224 are connected to receive clock signal C, while the p control inputs of TI 212, TI 214, TI 226 and TI 228 and the n control inputs of TI 216, TI 218, TI 222 and TI 224 are connected to receive complemented clock signal C/. Each tristate inverter generates an output signal which is the complement of the signal received at its input when a LOW signal is received at its p control input and a HIGH signal is received at its n control input.

Also shown in FIG. 2 is a clock enable circuit 230 which can be included with the flip-flop circuit to control the generation of signals C and C/. The enable circuit comprises NAND gates 235 and 239. Each NAND gate has an input connected to receive an external clock signal Clk and an enable signal Enbl. The output of NAND gate 235 is provided to an inverter 237 to generate signal C. The output of gate 239 is provided to inverters 241 and 243, connected in series, to generate signal C/. When the enable signal is held HIGH signals C and C/ are generated, signal C being equal to clock signal Clk and signal C/ being the complement of signal Clk. When the enable signal is LOW, signal C is held LOW and signal C/ is held HIGH.

The operation of the flip-flop circuit is as follows. Consider that initially clock signal C is LOW. Tristate inverters 212 and 214 are disabled and therefore data presented to the flip-flop on input lines 201 and 203 will not be accepted by the circuit. Tristate inverters 216, 218, 222 and 224 are all enabled and operate as described below to maintain output signals Q and Q/ at the last received values of D and D/, respectively.

When the state of clock signal C changes to HIGH, tristate inverters 216, 218, 222 and 224 are disabled, producing no output. Output signals Q and Q/ are maintained at their values prior to signal C changing state by the operation of enabled tristate inverters 226 and 228. TI 226 generates Q by inverting Q/, while TI 228 simultaneously inverts Q to produce Q/. The HIGH state of clock signal C enables TI 212 and TI 214, which invert input signals D and D/, respectively. The inverted D input signal, which is equivalent to signal D/, is provided on line 247 to disabled TI 222 and the inverted signal D/, which is equivalent to signal D, is provided on line 249 to disabled TI 224. New data is not placed onto the output lines 205 and 207 when clock signal C obtains a HIGH state.

At the change of state of clock signal C from HIGH to LOW, TI 212 and TI 214 are disabled. TI 216 and TI 218 are enabled to maintain the signal states residing on lines 247 and 249 at their values prior to signal C changing to its LOW state. TI 222 and TI 224 are enabled to invert the latched values present on lines 247 and 249, respectively, the outputs of these two tristate inverters being the new values for output signals Q and Q/. TI 226 and TI 228 are disabled.

The circuit operation continues as described above with every change of state of clock signal C. Data present at input terminals 201 and 203 during a HIGH state of clock signal C will be provided to outputs Q and Q/, respectively, at the change of state of signal C from HIGH to LOW, and latched until the next HIGH to LOW transition. In addition, incorporation of the enable circuitry into the flip-flop circuit permits additional control over the operation of the flip-flop. A LOW state for signal Enbl sets clock signal C to a LOW state, disabling tristate inverters 212, 214, 226 and 228 and enabling tristate inverters 216, 218, 222 and 224. The operational states of the tristate inverters are not permitted to change until signal Enbl goes HIGH.

Figure 3:
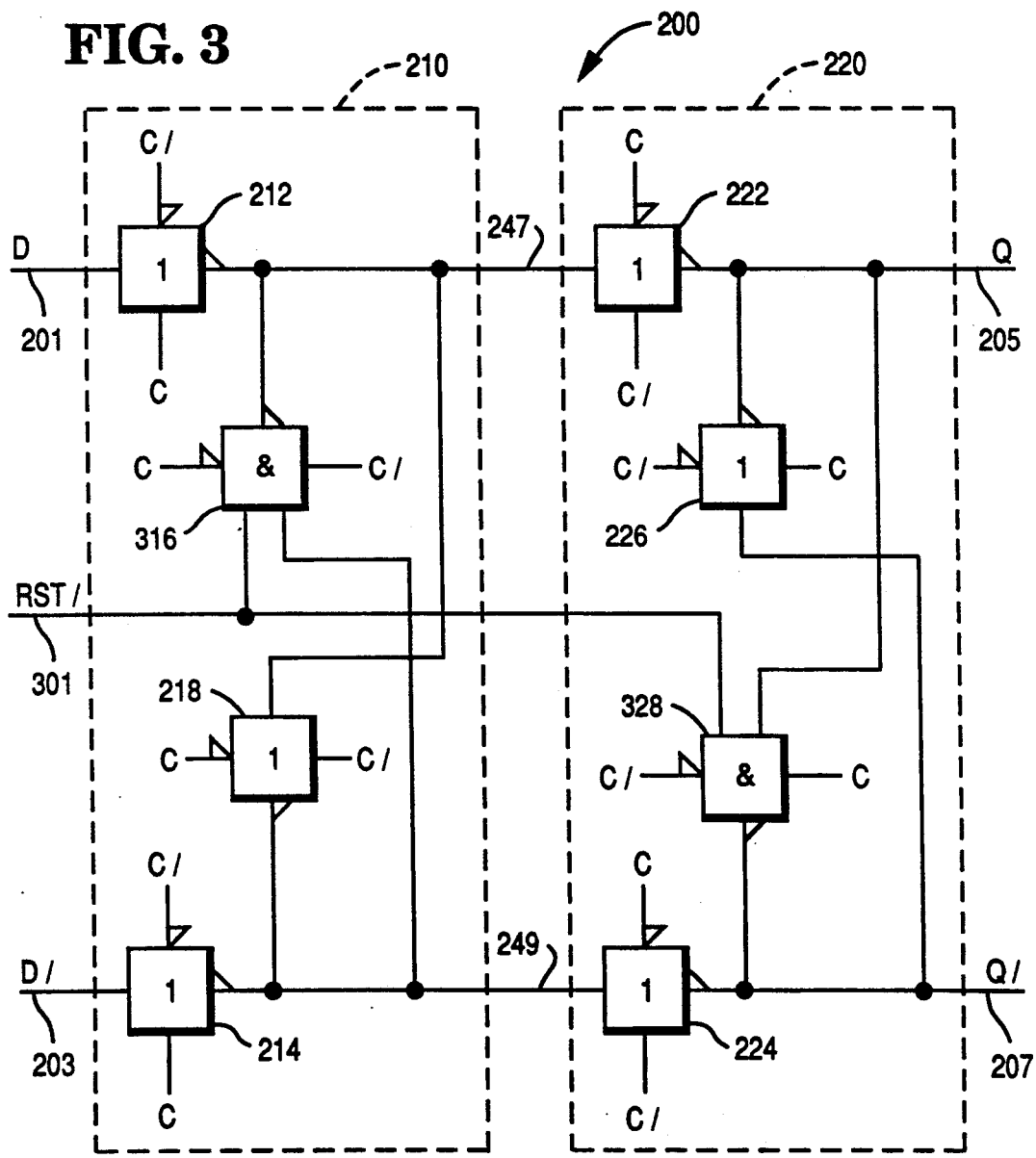
FIG. 3 is a schematic of a high speed, CMOS D-type flip-flop including an a synchronous reset, according to the present invention.

FIG. 3 is a schematic of a high speed, CMOS D-type flip-flop including an a synchronous reset, according to the present invention. The reset feature is provided by substituting clocked NAND gates 316 and 328 for tristate inverters 216 and 228 of FIG. 2. A reset signal RST/ is provided to one input of each clocked NAND gate via line 301. When signal RST/ is HIGH, the operation of the circuit of FIG. 3 is the same as that previously described in connection with the circuit of FIG. 2. When signal RST/ is LOW, output signals Q and Q/ are set LOW and HIGH, respectively. Inclusion of clocked NAND gates 318 and 328 into the flip-flop does, however, reduce the operating speed of the circuit.

It can thus be seen that there has been provided by the present invention a new and improved D-type CMOS flip-flop circuit. Through the use of tristate inverters and parallel data paths for D and D/ inputs, which eliminates the need for inverters to generate D/ and Q/ data signals, the circuit presented herein is capable of operating at clock speed much greater than prior art CMOS flip-flops.

The circuit design is intended for use in standard cell libraries or gate array libraries. The circuit of FIG. 2 has been simulated and compared with other standard cell and gate array offerings and shown to be forty percent faster than prior fast flip-flop library offerings. The present circuit will operate up to a maximum clock rate of two hundred megahertz under commercial operating conditions.

The circuit has been designed to minimize the effects of clock skew which come about as a result of the use of external gated clocks. This has been accomplished by the inclusion of a clock enable circuit, as shown in FIGS. 2 and 3, inside the flip-flop where the skew can be controlled by the cell designer.

Although the presently preferred embodiment of the invention has been described, it will be understood that various changes may be made within the scope of the appended claims.

What is claimed is:

1. A clocked, D-type, CMOS flip-flop comprising:
   a first input terminal for receiving a binary input signal and a second input terminal for receiving the complement of said binary input signal;
   a Q output terminal for providing a binary output signal and a Q/ output terminal for providing the complement of said binary output signal;
   a first data path for providing the binary input signal received at said first input terminal to said Q output terminal;
   a second data path for providing the complemented binary input signal received at said second input terminal to said Q/output terminal; and
   a master section and a slave section;
   said master section being responsive to a clock signal to provide binary output signals to said salve section when said clock signal has a first binary state and to store said last-recited binary output signals when said clock signal has a second binary state;
   said master section including first, second, third and fourth tristate inverters;
   said first tristate inverter being connected to receive said binary input signal;
   said second tristate inverter being connected to receive said second binary input signal;
   said third tristate inverter having its input connected to the output of said second tristate inverter and its output connected to the output of said first tristate inverter, the combined outputs of said first and third tristate inverters forming one output of said master section; and
   said fourth tristate inverter having its input connected to the output of said first tristate inverter and its output connected to the output of said second tristate inverter, the combined outputs of said second and fourth tristate inverters forming a second output of said master section; said slave section being responsive to said clock signal to provide binary output signals to said Q and Q/output terminals when said clock signal has said second binary state and to store said last-recited binary output signals when said clock signal has a second binary state,
   said slave section including fifth, sixth, seventh and eighth tristate inverters;
   said fifth tristate inverter being connected to receive the combined output of said first and third tristate inverters and having its output connected to said Q output terminal;
   said sixth tristate inverter being connected to receive the combined output of said second and fourth tristate inverters and having its output connected to said Q/output terminal;
   said seventh tristate inverter having its input connected to the output of said sixth tristate inverter and its output connected to said Q output terminal; and
   said eight tristate inverter having its input connected to the output of said fifth tristate inverter and its output connected to said Q/ output terminal;
   said first, second, seventh and eighth tristate inverters being responsive to said clock signal to generate output when said clock signal has said first binary state; and
   said third, fourth, fifth and sixth tristate inverters being responsive to said clock signal to generate output when said clock signal has said second binary state.

2. A fast latching D-type CMOS flip-flop comprising:
   a master section including first, second, third and fourth tristate inverters;
   said first tristate inverter being connected to receive a first binary input signal;
   said second tristate inverter being connected to receive the complement of said binary input signal;
   said third tristate inverter having its input connected to the output of said second tristate inverter and its output connected to the output of said first tristate inverter, the combined outputs of said first and third tristate inverters forming a first output of said master section; and
   said fourth tristate inverter having its input connected to the output of said first tristate inverter and its output connected to the output of said second tristate inverter, the combined outputs of said second and fourth tristate inverters forming a second output of said master section; a slave section including fifth, sixth, seventh and eighth tristate inverters;
   said fifth tristate inverter being connected to receive the combined output of said first and third tristate inverters;
   said sixth tristate inverter being connected to receive the combined output of said second and fourth tristate inverters;
   said seventh tristate inverter having its input connected to the output of said sixth tristate inverter and its output connected to the output of said fifth tristate inverter, the combined outputs of said fifth and seventh tristate inverters forming a first output of said flip-flop; and
   said eighth tristate inverter having its input connected to the output of said fifth tristate inverter and its output connected to the output of said sixth tristate inverter, the combined outputs of said sixth and eighth tristate inverters forming a second output of said flip-flop;
   said first, second, seventh and eighth tristate inverters being responsive to a clock signal to generate output when said clock signal has a first binary state; and
   said third, fourth, fifth and sixth tristate inverters being responsive to said clock signal to generate output when said clock signal has a second binary state.

3. The CMOS flip-flop according to claim 2, further comprising a clock enabling circuit.

4. The CMOS flip-flop according to claim 3, wherein said clock enabling circuit comprises:
   first means responsive to an enable signal for passing said clock signal when said enable signal has a first binary state and blocking transmission of said clock signal when said enable signal has a second binary state; and second means for generating the complement of the output of said first means.

5. The CMOS flip-flop according to claim 4, wherein:

said first means comprises a first NAND gate for receiving said clock signal and said enable signal, and a first inverter for receiving the output of said first NAND gate; and said second means comprises a second NAND gate for receiving said clock signal and said enable signal, a second inverter for receiving the output of said second NAND gate, and a third inverter for receiving the output of said second inverter.

6. A fast latching D-type CMOS flip-flop comprising:

a master section including first, second and third tristate inverters and a first clocked NAND gate;

said first tristate inverter being connected to receive a first binary input signal;

said second tristate inverter being connected to receive the complement of said binary input signal;

said third tristate inverter having its input connected to the output of said second tristate inverter and its output connected to the output of said first tristate inverter, the combined outputs of said first and third tristate inverters forming a first output of said master section; and said first clocked NAND gate having a first input connected to the output of said first tristate inverter, a second input connected to receive a reset signal, and its output connected to the output of said second tristate inverter; and a slave section including fifth, sixth, and seventh tristate inverters and a second clocked NAND gate;

said fourth tristate inverter being connected to receive the combined output of said first and third tristate inverters;

said fifth tristate inverter being connected to receive the combined output of said second tristate inverter and said first clocked NAND gate;

said sixth tristate inverter having its input connected to the output of said fifth tristate inverter and its output connected to the output of said fourth tristate inverter, the combined outputs of said fourth and sixth tristate inverters forming a first output of said flip-flop; and said second clocked NAND gate having a first input connected to the output of said fourth tristate inverter, a second input connected to receive a reset signal, and its output connected to the output of said fifth tristate inverter, the combined outputs of said fifth tristate inverter and said second clocked NAND gate forming a second output of said flip-flop; and said first, second and sixth tristate inverters and said second clocked NAND gate being responsive to a clock signal to generate output when said clock signal has a first binary state; and said third, fourth and fifth tristate inverters and said first clocked NAND gate being responsive to said clock signal to generate output when said clock signal has a second binary state.

* * * * *